US007085133B2

(12) United States Patent
Hall

(10) Patent No.: US 7,085,133 B2
(45) Date of Patent: Aug. 1, 2006

(54) COOLING USING COMPLIMENTARY TAPERED PLENUMS

(75) Inventor: Shawn Anthony Hall, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 10/616,745

(22) Filed: Jul. 9, 2003

(65) Prior Publication Data

US 2005/0022967 A1    Feb. 3, 2005

(51) Int. Cl.
*H05K 7/20* (2006.01)
(52) U.S. Cl. ...................... 361/695; 454/184
(58) Field of Classification Search ........ 361/687–690, 361/694, 695, 721; 174/16.1; 165/104.33, 165/122; 454/184
See application file for complete search history.

(56) References Cited

U.S. PATENT DOCUMENTS

| | | | | |
|---|---|---|---|---|
| 4,612,979 A | * | 9/1986 | Heitzig ........................ | 165/129 |
| 5,361,188 A | * | 11/1994 | Kondou et al. ............. | 361/695 |
| 5,528,454 A | * | 6/1996 | Niklos ........................ | 361/695 |
| 5,721,670 A | * | 2/1998 | Cochrane et al. ........... | 361/695 |
| 5,995,368 A | * | 11/1999 | Lee et al. .................... | 361/695 |
| 6,222,729 B1 | * | 4/2001 | Yoshikawa .................. | 361/695 |
| 6,283,850 B1 | * | 9/2001 | Toshimitsu et al. ......... | 454/184 |
| 6,400,567 B1 | * | 6/2002 | McKeen et al. ............ | 361/695 |
| 6,459,579 B1 | * | 10/2002 | Farmer et al. ............... | 361/695 |
| 6,480,381 B1 | * | 11/2002 | Negishi ....................... | 361/695 |
| 6,625,020 B1 | * | 9/2003 | Hanson et al. .............. | 361/695 |
| 6,704,198 B1 | * | 3/2004 | Replogle et al. ............ | 361/690 |
| 6,717,807 B1 | * | 4/2004 | Hikawa ....................... | 361/690 |
| 6,742,583 B1 | * | 6/2004 | Tikka ......................... | 165/291 |
| 6,912,129 B1 | * | 6/2005 | Baker et al. ................ | 361/695 |

FOREIGN PATENT DOCUMENTS

| | | | |
|---|---|---|---|
| JP | 56147458 A | * | 11/1981 |
| JP | 01089599 A | * | 4/1989 |
| JP | 04027197 A | * | 1/1992 |
| JP | 05327253 A | * | 12/1993 |

OTHER PUBLICATIONS

Chandrakant D. Patel ,et al., "Computational Fluid Dynamics Modeling of High Compute Density Data Centers to Assure System Inlet Air Specifications", Proceedings of IPACK'01, Jul. 8-13, 2001, Kauai, Hawaii, USA, pp. 1-9.
R.K. Sahoo, et al., "Numerical investigation of free convective flow in divergent channels.", Comput. Methods Appl. Mech. Engrg, 146 (1997), pp. 31-41.

* cited by examiner

*Primary Examiner*—Boris Chervinsky
(74) *Attorney, Agent, or Firm*—Daniel P. Morris; David Aker

(57) ABSTRACT

Where a fluid cooling medium cools a plurality of heat-producing devices arranged in a row along a generalized coordinate direction, with a space between each adjacent pair of devices, each space may have a partition that defines a boundary between a first plenum and a second plenum. The first plenum carries cooling medium across an entrance and thence into a first heat-producing device located on a first side of the partition facing the first plenum. The second plenum carries cooling medium away from a second heat-producing device located on a second side of the partition facing the second plenum and thence across an exit. The partition is disposed so that the first plenum becomes smaller in cross-sectional area as distance increases from the entrance, and the second plenum becomes larger in cross sectional area as distance decreases toward the exit.

23 Claims, 8 Drawing Sheets

$$\beta \equiv \frac{x_H}{x_H + x_C}$$

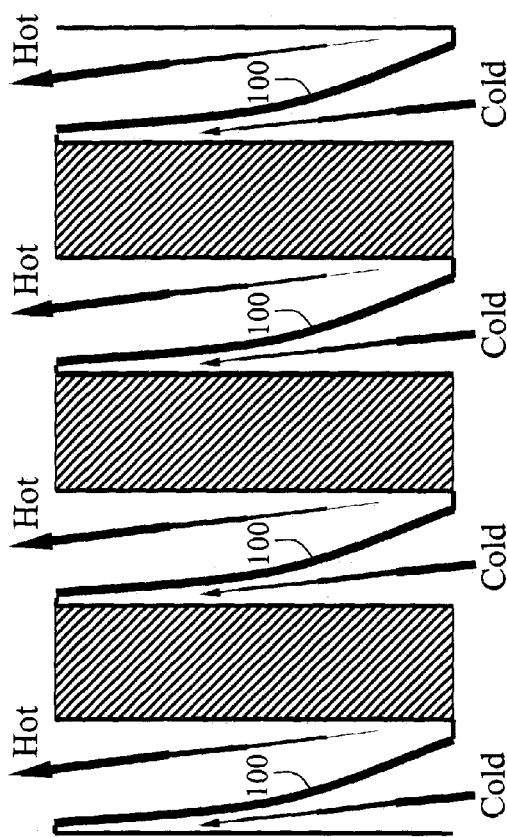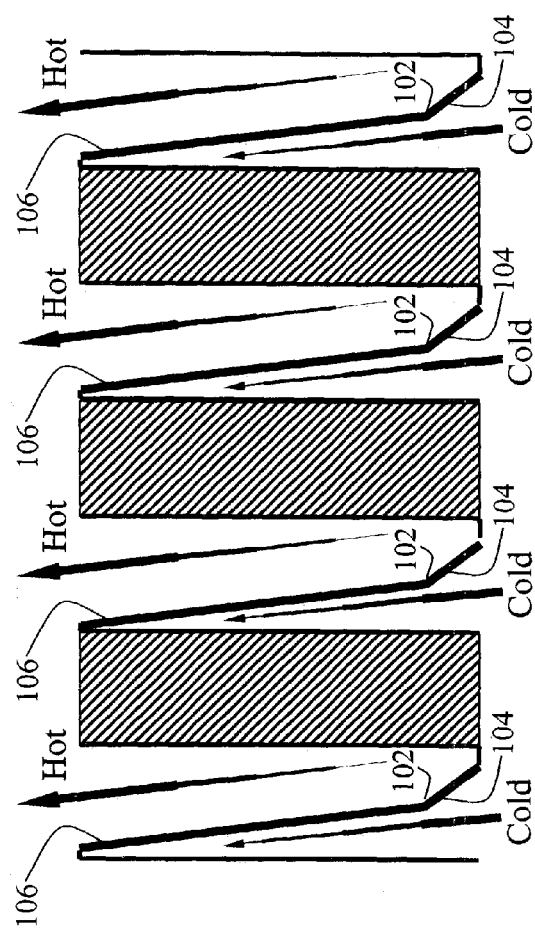

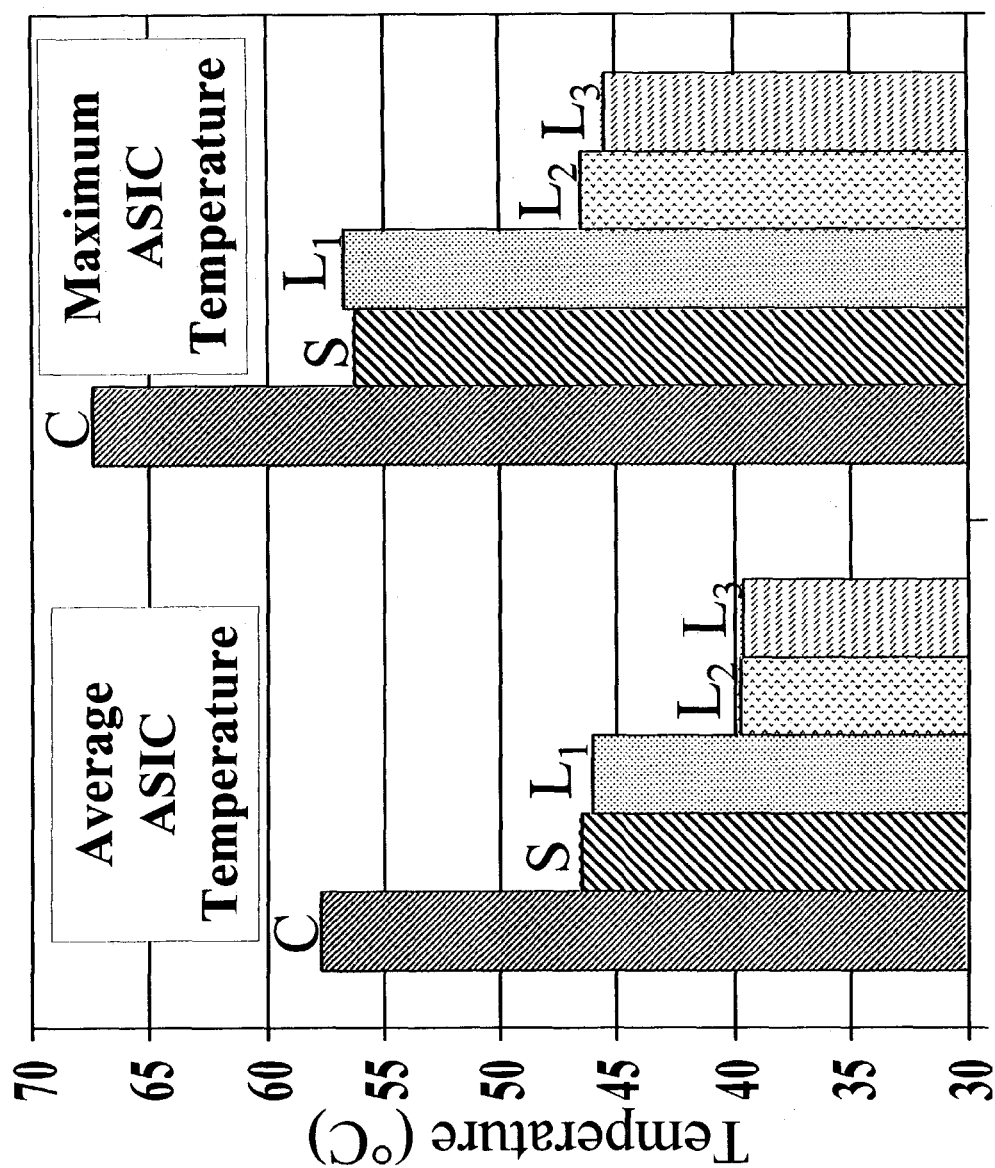

ized coordinate direction, with a space between each adjacent
COOLING USING COMPLIMENTARY TAPERED PLENUMS This invention was made with government support under Department of Energy Contract No. B517552. The government has certain rights in this invention.

FIELD OF THE INVENTION

This invention relates to the cooling of equipment that produces heat, and in particular to the cooling of electronic equipment. More particularly it is related to apparatus and methods used to cool racks of electronic equipment, and still more particularly to racks of electronic equipment of the type used in a data storage center.

BACKGROUND OF THE INVENTION

For air-cooled, heat-producing electronic equipment requiring two or more racks arranged in rows on a raised floor, such as in a large computer installation, the cooling system may cause air to flow across the electronics in any of the three coordinate directions. Let X be the direction along a row, Y be perpendicular to the rows, and Z be upward. For systems in which the air flows across the electronics in the X direction, air-flow plenums typically must exist between each pair of racks.

FIG. 1 illustrates a prior-art arrangement of such plenums, 22A, 24A, 22B, 24B, interspersed between a row of heat-producing racks 20A, 20B, 20C. Although the figure depicts just three racks, in general the row may contain an arbitrary number of such racks. In the prior-art, hot plenums 22A, 22B and cold plenums 24A, 24B alternate along the row, as shown in FIG. 1, such that racks 20A and 20B share the cold-air supply provided by cold plenum 24A, while racks 20B and 20C share the hot-air exhaust provided by hot plenum 22B. This sharing scheme continues along the row as suggested by the air-flow arrows at the extreme right and left of the figure. As shown in FIG. 1, the hot plenums 22A and 22B are closed at their bottoms, while the cold plenums 24A and 24B are closed at their tops. As shown by the arrows 26A, 26B, 26C and 26D, air flows upward from the raised floor 28, through holes in floor tiles, into the cold plenums 24A and 24B, and is drawn into the adjoining racks 20A, 20B and 20C as indicated by the arrows 27. After flowing across the electronics in a rack (generally in the form of circuit cards, as more fully described with respect to FIG. 3A), the air emerges into a hot plenum 22A or 22B, as shown by the arrows 29, where it is joined by air emerging likewise from the rack on the opposite side of the hot plenum. This air flows upward to the exhaust, generally to be re-circulated after cooling.

The present invention is based on a discovery of a problem with this prior-art scheme; namely, that it does not efficiently use the space occupied by the plenums, because the constant width of the plenums is not matched to the variable volumetric flow rate of air that the various horizontal cross sections of the plenums must carry.

Specifically, the volumetric flow rate of air in each cold plenum is greatest at the bottom, because the bottom cross section must carry the full complement of air to feed the entire pair of adjoining racks. As distance z from the floor 28 increases, the volumetric flow rate in the cold plenum gradually diminishes as air flows into the racks. Finally, near the top of the cold plenum, the volumetric flow rate is nearly zero, inasmuch as nearly all the air has flowed into the racks.

This inefficiency of the prior art is depicted graphically in FIG. 1 by the upwardly decreasing thickness of the arrows 26A, 26B, 26C and 26D in the cold plenums 24A and 24B. The arrows' thickness decreases to emphasize that a cold plenum carries a lower and lower volumetric flow rate of air as z increases, inasmuch as its air is drawn into the adjoining racks as indicated by arrows 27. If the distribution of electronics is uniform top to bottom, the diminution of air flow in the cold plenums is roughly linear in z. In particular, the upward air flow is zero at the top of the cold plenum. In spite of this variable flow situation, the cross-sectional area of the prior-art cold plenum is the same top to bottom. Thus space is wasted near the top of the cold plenum.

Likewise, the inefficiency of the prior art is depicted in FIG. 1 by the upwardly increasing thickness of the arrows 32A, 32B, 32C and 32D in the hot plenums 22A and 22B. The arrows' thickness increases to emphasize that a hot plenum carries a higher and higher flow rate of air as z increases, inasmuch as it collects air along the entire height of the adjoining racks as indicated by arrows 29. Finally, at the top, the volumetric flow rate in the hot plenums 22A and 22B is a maximum, because the top cross section must carry the accumulated complement of air that has emerged from the entire height of the adjoining racks. In spite of this variable flow situation, the cross sectional area of the prior-art hot plenum is the same top to bottom. Thus space is wasted near the bottom of the hot plenum.

SUMMARY OF THE INVENTION

It is an object of the invention to provide an arrangement for the flow of coolant that efficiently and effectively cools heat-producing devices.

It is another object of the invention to provide an arrangement for the flow of coolant that efficiently and effectively cools racks of electronic equipment.

It is a further object of the invention to provide an arrangement for the flow of coolant which is efficient in the utilization of valuable space.

Thus, the invention is directed toward an apparatus that uses a fluid cooling medium to cool a plurality of heat-producing devices arranged in a row along a generalized coordinate direction, with a space between each adjacent pair of devices. The apparatus comprises, in each space, a partition that defines a boundary between a first plenum and a second plenum, the first plenum being used to carry cooling medium across an entrance and thence into a first heat-producing device located on a first side of the partition facing the first-plenum, and the second plenum being used to carry cooling medium away from a second heat-producing device located on a second side of the partition facing the second-plenum and thence across an exit, wherein the partition is disposed so that the first plenum becomes smaller in cross-sectional area as distance increases from the entrance, and the second plenum becomes larger in cross sectional area as distance decreases toward the exit.

The heat-producing devices may be disposed in parallel to one another, with a first plenum and a second plenum disposed between each adjacent pair of heat-producing devices, and the first plenum and the second plenum being complimentary in size and shape so as to occupy the space between adjacent heat-producing devices.

The partition is angled with respect to the two adjacent heat-producing devices so as to extend from a position that is, at the entrance, further from the first heat-producing device than it is from the second heat-producing device, and is, at the exit, further from the second heat-producing device than it is from the first heat-producing device.

The heat-producing devices may be collections of equipment disposed in racks, and in particular may be electronic equipment disposed in racks. The apparatus may further comprise a floor for supporting the racks, the floor having a space beneath it for conducting the cooling medium to the first plenums. Floor tiles with openings may be disposed so that the cooling medium flows through the openings from the space below the floor into the first plenums.

The apparatus may further comprise a fluid-moving apparatus for facilitating flow of the cooling medium. The fluid-moving apparatus may circulate the cooling medium from the second plenums to the space below the floor. The fluid-moving apparatus may comprise a plurality of fans. The fans may be disposed in planar arrays adjacent to the heat-producing devices.

The fluid-moving apparatus may comprise apparatus that circulates the cooling medium from the second plenums to the space below the floor, and a plurality of fans the fans disposed in planar arrays adjacent to the heat-producing devices. The apparatus may further comprise cooling apparatus for cooling the medium after it leaves the second plenums and prior to returning it to the space beneath the floor.

The partition may be substantially planar or it may be curved, and in particular, it may be curved to be convex toward the first plenum. The partition may have at least one bend along a line so as to define a plurality of planar regions. The at least one bend in the partition may reduce the cross section of the first plenum and increases cross section of the second plenum.

The partition may have a bend that results in a first region having a first angle $\theta_1$ with respect to a plane of the heat-producing device through which cooling medium enters the heat producing device, and a second region having a second angle $\theta_2$ with respect to the plane, where $\theta_1$ is greater than $\theta_2$, and the first region is smaller in size than the second region.

The second plenum may be larger in volume than the first plenum.

The apparatus of the invention may be combined with at least one row of heat-producing devices in a room, and at least one fluid-moving apparatus for facilitating flow of the cooling medium.

The invention is also directed to an arrangement for a room, comprising spaced parallel units of heat-producing equipment, and between the units of equipment, a partition defining a boundary between a first plenum for conveying a cooling medium to enter a first piece of the equipment and a second plenum for conveying the cooling medium from a second piece of the equipment, wherein the partition is disposed so that the first plenum becomes smaller in cross sectional area as distance increases from where cooling fluid enters the first plenum, and so that the second plenum becomes larger in cross sectional area as distance decreases to where the fluid leaves the second plenum.

The invention is further directed to a method for configuring apparatus for cooling rows of equipment with a cooling medium, comprising placing a partition so as to define a boundary between a first plenum for carrying the cooling medium to enter the rows of equipment and a second plenum for carrying the cooling fluid after it has cooled the equipment, wherein the partition is placed so that the first plenum becomes smaller in cross sectional area as distance increases from where cooling fluid enters the first plenum, and so that the second plenum becomes larger in cross sectional area as distance decreases to where the fluid leaves the second plenum.

BRIEF DESCRIPTION OF THE DRAWINGS

These and other aspects, features, and advantages of the present invention will become apparent upon further consideration of the following detailed description of the invention when read in conjunction with the drawing figures, in which:

FIG. 7 is a cross sectional view that illustrates a second embodiment of the invention;

FIG. 8 is a cross sectional view that illustrates a third embodiment of the invention; and FIG. 9 is a graphical comparison between the prior art, the present invention, and the theoretical case of infinitely wide plenums.

DETAILED DESCRIPTION OF THE PREFERRED EMBODIMENTS

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

Figure 1:
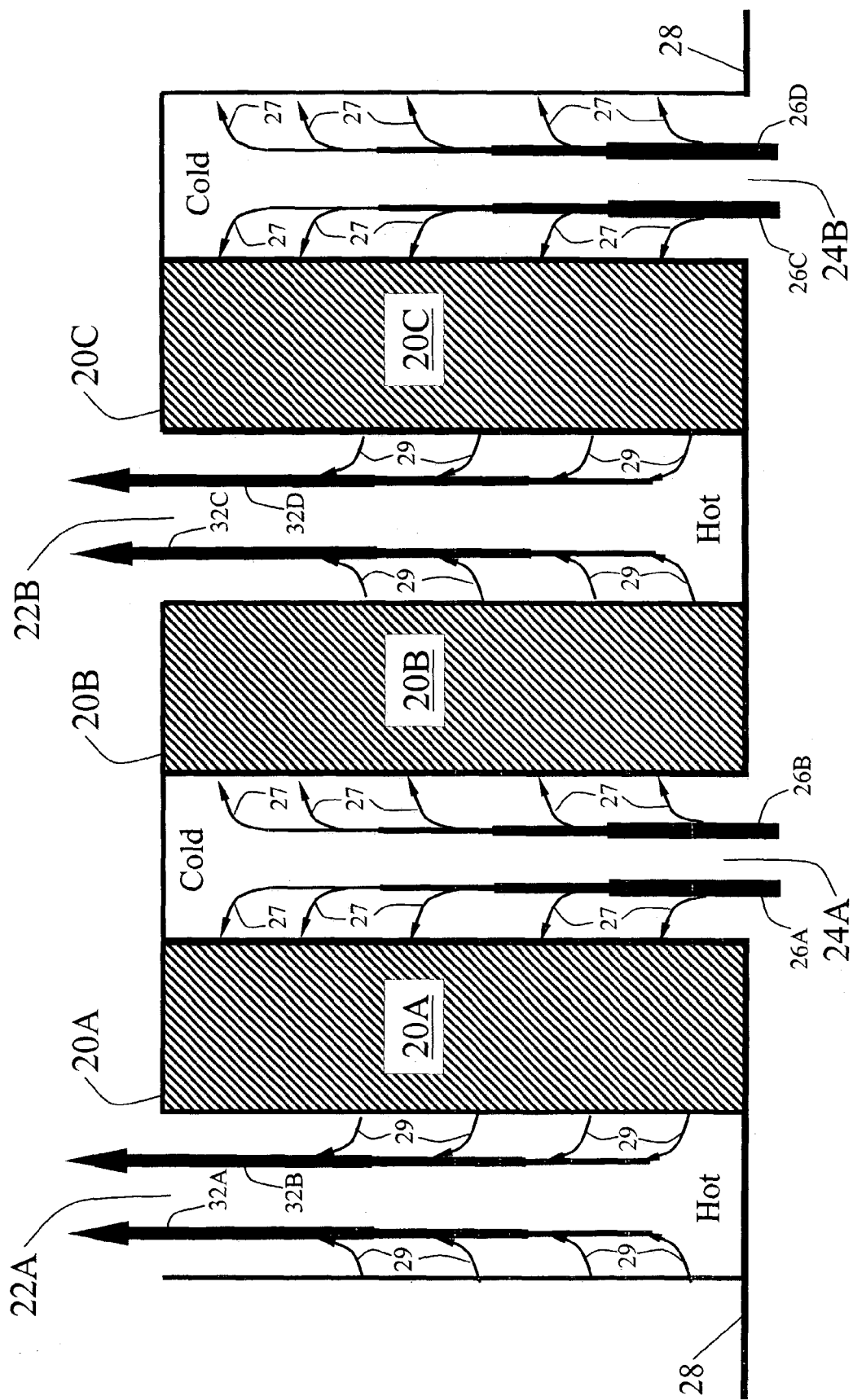
FIG. 1 is a cross sectional view of a prior art cooling arrangement.
Figure 2:
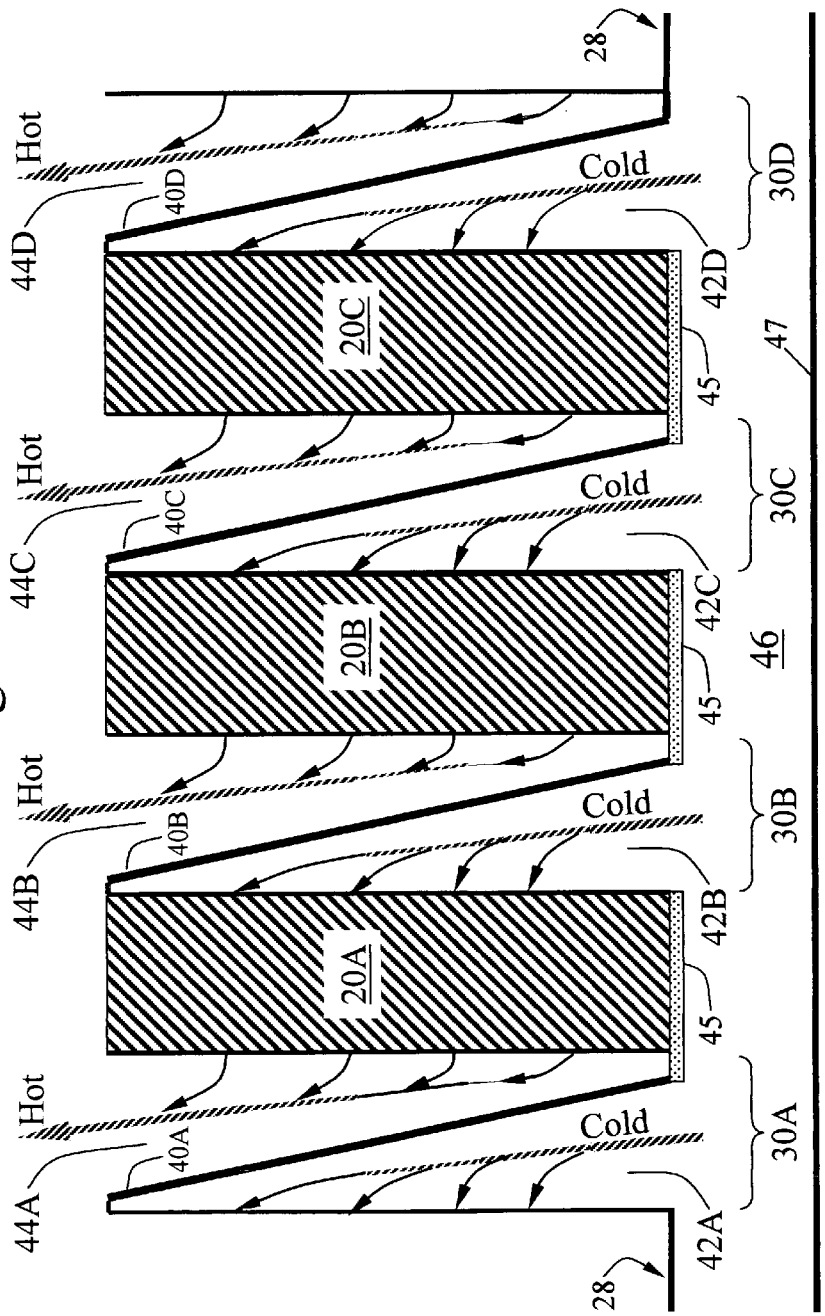
FIG. 2 is a cross-sectional view of an embodiment of a cooling arrangement in accordance with the invention.

Referring to FIG. 2, the inter-rack spaces 30A, 30B, 30C, 30D (configured in the prior art of FIG. 1 as alternating hot and cold plenums 22A, 24A, 22B, and 24B) are instead r configured, in accordance with the invention, by dividing each inter-rack space, via a sloping partition, into a complimentary pair of tapered hot and cold plenums. Thus the inter-rack space 30A is divided by sloping partition 40A into the cold plenum 42A and hot plenum 44A; the inter-rack space 30B is divided by sloping partition 40B into cold plenum 42B and hot plenum 44B; the inter-rack space 30C is divided by sloping partition 40C into cold plenum 42C and hot plenum 44C; and the inter-rack space 30D is divided by sloping partition 40D into cold plenum 42D and hot plenum 44D. Thus racks 20A, 20B, 20C receive cold air from cold plenums 42B, 42C, 42D respectively, and exhaust hot air into hot plenums 44A, 44B, 44C respectively.

This novel arrangement of plenums exploits the observation, described earlier, that volumetric flow rate in the cold plenum decreases with distance z from the raised floor shown generally as 28, whereas volumetric flow rate in the hot plenum increases with z. Floor 28 has tiles 45, above a space 46, for conducting the cooling medium, space 46 being defined between tiles 45 and a floor 47. That is, the hot and cold plenums are naturally complementary; at a height where the volumetric flow rate in minimum in one, it is maximum in the other, and vice versa. By segregating the hot and cold plenums, the prior art fails to exploit this complementarity. In contrast, the present invention deliberately exploits it. By integrating a hot and cold plenum between each pair of racks, and separating the hot plenum from the cold by a sloping partition, the width (i.e. the cross sectional area) of each plenum is roughly matched, as a function of z, to the local volumetric flow rate. Moreover, because the partition walls 40A, 40B, 40C, 40D are sloped, the air flowing through each rack turns corners that are less sharp than in the prior-art scheme. For both reasons, it is therefore possible with this invention, in a fixed amount of plenum space, to incur less pressure drop and thereby to carry more air (for a given arrangement of fans or blowers), leading to enhanced cooling and lower temperatures of the electronics.

Thermal insulation of the sloping partition may or may not be required depending on the particular application. As a guideline, it is helpful to compute the heat-transfer rate Q across the sloping partition as a fraction of the total heat-transfer rate $Q_{TOTAL}$ through the rack. If this fraction $Q/Q_{TOTAL}$ is small, then the loss through the wall may be relatively negligible and insulation may not be needed. Let k, $\rho$, c, v, $\alpha$, and Pr be respectively the thermal conductivity, density, specific heat, kinematic viscosity, thermal diffusivity, and Prandtl number of air. Let U be the free-stream velocity at mid-height on the partition wall, L be the length of the partition wall in the flow (Z) direction, $A_{WALL}$ be the wetted area of the partition wall, V be the volumetric flow rate of air through the rack, $\Delta T$ be the air-temperature rise through the rack, and h be the film-transfer coefficient for convective heat transfer at the wall. Then, $$Q = hA_{WALL}\Delta T \quad (1.1)$$

$$Q_{TOTAL} = \rho c V \Delta T, \quad (1.2)$$

where an appropriate expression for h is that for the average convective heat transfer on a flat plate, $$h = 0.664 k \sqrt[3]{Pr} \sqrt{\frac{U}{vL}}, \quad (1.3)$$

as given by Eckert and Drake, *Heat and Mass Transfer*, McGraw Hill, 1959, which is hereby incorporated by reference in its entirety. Writing $$V = U A_{PLENUM} \quad (1.4)$$

where $A_{PLENUM}$ is the cross-sectional area of the hot plenum at mid-height, and using the definitions of Prandtl number, $$Pr \equiv \frac{v}{\alpha} = \frac{\rho c v}{k}, \quad (1.5)$$

and Reynolds number based on L, $$Re_L \equiv \frac{UL}{v}, \quad (1.6)$$

it is found that substitution of eqs. (1.3) through (1.6) into eqs. (1.1) and (1.2) yields $$\frac{Q}{Q_{TOTAL}} = 0.664 \; Pr^{-2/3} Re_L^{-1/2} \left(\frac{A_{WALL}}{A_{PLENUM}}\right). \quad (1.7)$$

The Prandtl number of air is about Pr=0.7. For a typical rack, the area ratio in equation (1.7) is $$\left(\frac{A_{WALL}}{A_{PLENUM}}\right) \sim 10 \quad (1.8)$$

and the length of the sloping partition is $$L \sim 2 \text{ m}. \quad (1.9)$$

A typical value of velocity is $$U \sim 5 \text{ m/s}. \quad (1.10)$$

Substituting these values into eq. (1.7) yields $$\frac{Q}{Q_{TOTAL}} = 0.015 \quad (1.11)$$

That is, in such a typical case, only 1.5 percent of the heat flux $Q_{TOTAL}$ crosses through the partition wall, so in such a case, it may be permissible to leave the partition wall un-insulated, depending on the tradeoff of performance and cost.

Inasmuch as the invention provides optimal, space-efficient cooling of electronics in raised-floor installations, it is important for several reasons:

A. Keeping electronic chips cool is extremely important. According to a common rule of thumb used for processing chips, a chip's lifetime doubles and its performance (speed) increases 2–3 percent for every 10 degrees Celsius it is run below its maximum (spec) temperature.

B. The cost of floor space in such an installation is high; air-flow plenums may occupy a considerable fraction of the total and thus represent a considerable cost.

C. Inasmuch as raised floor tiles are always 24 inch (61 cm) square, it is advantageous to package the racks on a center-to-center distance that is a "round number", such as 24 inches (61 cm) or 36 inches (91.4 cm), because then each rack (or every other rack) is synchronized with the floor tiles, such that only one type (or two types) of raised-floor opening holes must be designed for entrance to the cold plenums.

D. Under a fixed-space constraint such as that described in (C.), space-efficient plenums may make the difference between success and failure for a design where a large amount of electronics must be packaged in the fixed space and yet remain cool. In the prior-art method, any attempt to meet such a fixed-space requirement simply by shrinking the width of the plenums is ineffective, because the air flow is thereby constricted. This leads to higher temperatures and therefore shorter life and, compromised performance of the electronic components.

E. Space-efficient plenums allow racks to be closer together, which may lead to improved signal integrity on interconnecting cables.

Figure 3A:
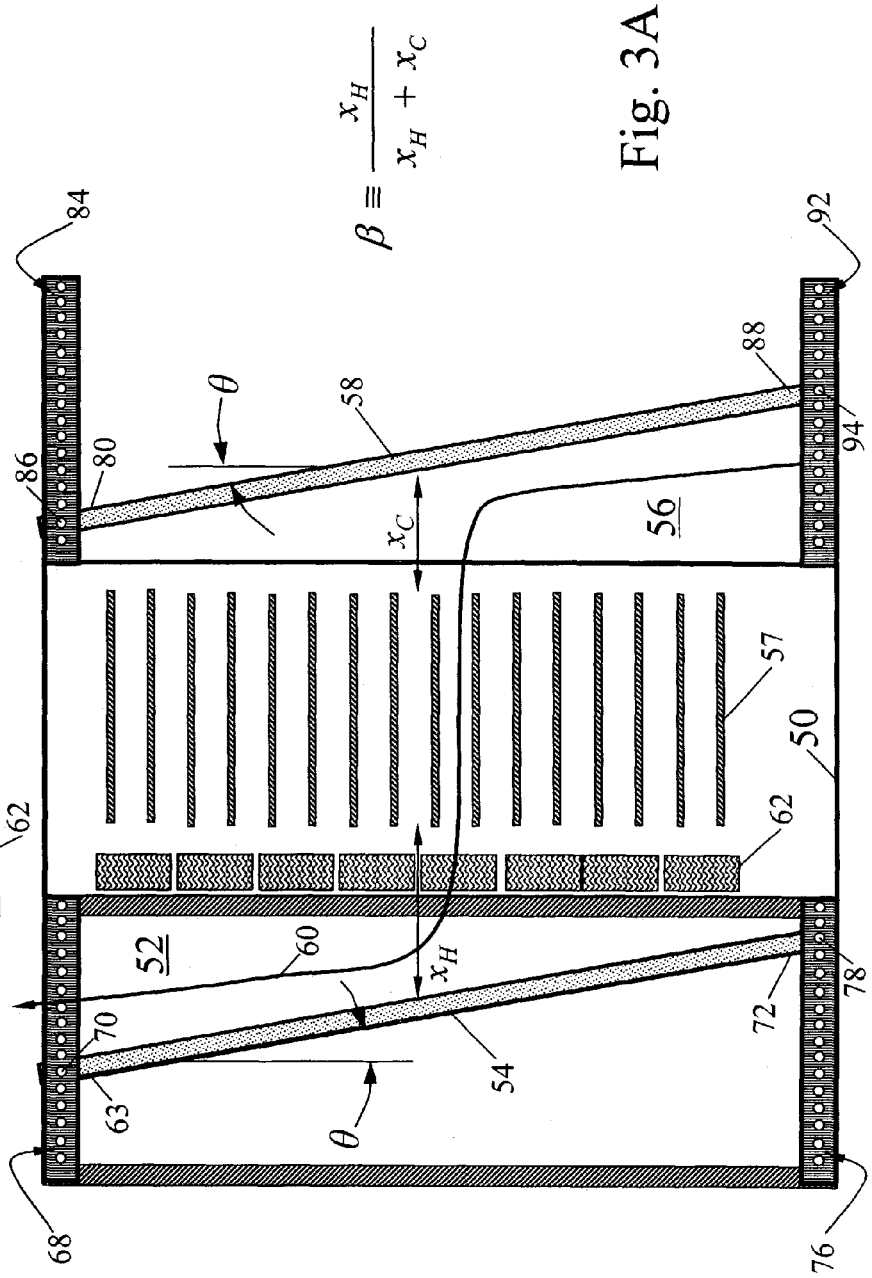
FIG. 3A is a front, elevational view of an experimental cooling arrangement with front closure panels removed for purposes of illustration.
Figure 3B:
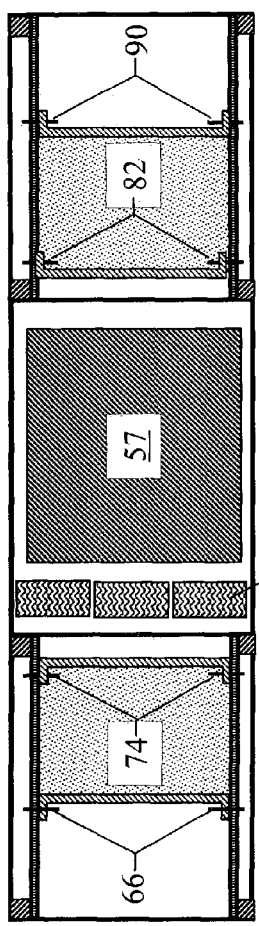
FIG. 3B is a plan view of the arrangement of FIG. 3A.

Referring to FIG. 3A and FIG. 3B, the invention may be modeled in a thermal prototype comprising a rack 50 of electronics of the type used in a super-computer system. Rack 50 is flanked on the left side by a prototype hot plenum 52, having a size defined by the position and angle of the sloping hot-side partition 54. Likewise, rack 50 is flanked on the right side by a prototype cold plenum 56, having a size defined by the position and angle of the sloping cold-side partition 58. Prototype. rack 50 is thus analogous to rack 20B in FIG. 2, and the hot-side and cold-side partitions 54 and 58 are analogous, respectively, to the sloping partitions 40B and 40C in FIG. 2, such that the prototype system is one "unit cell" of the row of racks in FIG. 2.

During operation of the prototype system, heat is generated by several hundred mock-up, heat-sinked chips (not shown) located on circuit cards 57, each of which lies in a horizontal plane inside rack 50. A representative sample of fifty-one of these mock-up chips are instrumented with thermocouples (not shown) to measure the chips' case temperatures.

Circulation of air, along paths such as 60, is provided by a planar array of fans 62, which form a continuous wall, and thus provide cooling by forced convection. These fans may be axial fans of the type manufactured by Delta Electronics or ebm Industries. Other air-moving devices may be used in addition to or instead of the wall of fans. For example, forced convection may be enhanced by an additional wall of fans upstream of the circuit cards 57, or alternatively may be provided by one or more blowers located either at the bottom of the cold plenum 56 or at the top of the hot plenum 52. The advantage of the wall of fans 62 vis-à-vis blowers is that the pressure rise provided by the fans is distributed across the entire plane at the left in FIG. 3A of the stack of circuit cards 57, thereby allowing flow balancing among the stack of circuit cards to be accomplished simply and flexibly by adjustment of fan speeds. In contrast, the pressure rise provided by a single blower is concentrated at one place, thereby requiring, for the avoidance of uneven flow through the various circuit cards, mechanical balancing mechanisms requiring tedious (and perhaps sensitive) adjustment.

In practice, forced-air circulation may also be enhanced by a floor-mounted modular air-cooling unit of the type described by C. D. Patel et al. in Computational Fluid Dynamics Modeling of High Compute Density Data Centers to assure System Inlet Air Specifications, Proceedings of IPACK2001-15622 (2001). Reference is made to FIG. 1 of this paper. However, it will be understood that any of a number of air-moving devices may be utilized with the invention.

In order to test different sizes and shapes of the plenums, the left-to-right position of the top end 63 of the hot-side partition 54 is adjusted in discrete increments by attachment via screws 66 (FIG. 3B) to any one of a series of tapped holes 68. As shown in FIG. 3A, it happens to be attached at tapped hole 70. Similarly, the left-to-right position of the bottom end 72 of the hot-side partition 54 is adjusted, independently of the top, by attachment via screws 74 (FIG. 3B) to any one of a series of tapped holes 76; in FIG. 3A, it happens to be attached to hole 78.

The situation for the cold-side partition 58 is analogous: the left-to-right position of its top end 80 is adjusted in discrete increments by attachment via screws 82 (FIG. 3B) to any one of a series of tapped holes 84; in FIG. 3A, it happens to be attached to tapped hole 86. Similarly, the left-to-right position of the bottom end 88 of the cold-side partition 58 is adjusted, independently of the top, by attachment via screws; 90 (FIG. 3B) to any one of a series of tapped holes 92; in FIG. 3A, it happens to be attached to hole 94.

Thus there are four independent adjustments at the four series of holes 68, 76, 84, 92, thereby allowing simulation of the non-tapered plenums used in the prior art (FIG. 1), as well as the tapered plenums in accordance with the invention (FIG. 2).

The four adjustments represent four degrees of freedom in the arrangement of FIG. 3A and FIG. 3B. Among these four degrees of freedom, two constraints are imposed. First, the two walls must be parallel to create a consistent geometry for the several racks in a row, such as shown in FIG. 2. Second, a fixed pitch between racks is selected. To obtain the benefits A. to E. outlined above, a rack pitch of 36 inches (91.4 cm) is selected.

Thus, there are two degrees of freedom left, which may be represented by the following two parameters:

θ=Plenum wall angle with respect to vertical, as shown in FIG. 3A.

β=Fraction of plenum space devoted to the hot side (as measured from left and right edges of circuit cards to plenum walls at a point Z midway from lowest circuit card to highest). That is, referring to FIG. 3A, $$\beta \equiv \frac{x_H}{x_H + x_C}.$$

Figure 4:
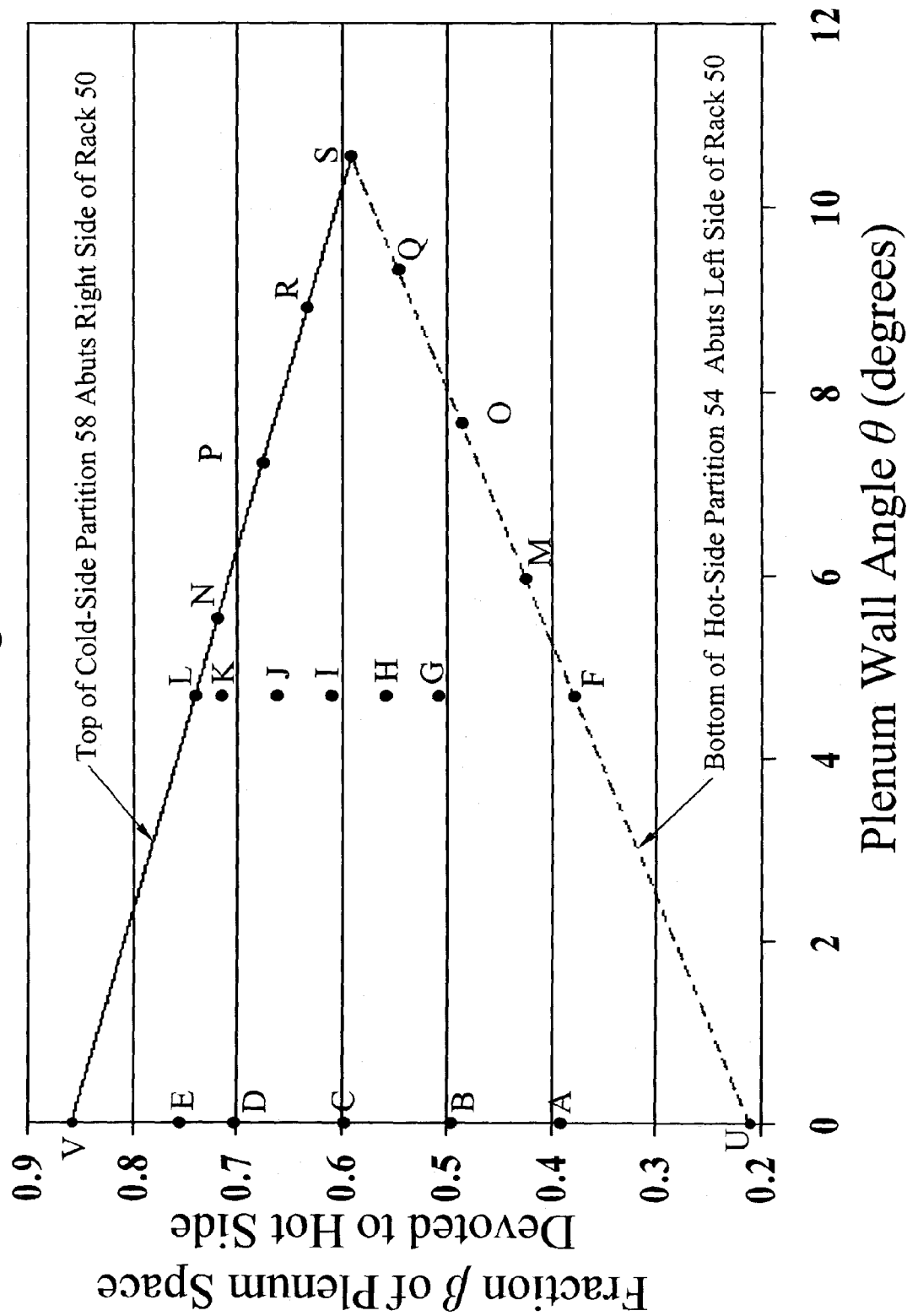
FIG. 4 is a graphical representation of possible placements for the sloping partitions of the cooling apparatus illustrated in FIG. 3A and FIG. 3B.

With this parameterization, the prior art is confined to θ=0, whereas this invention permits θ to be greater than or equal to 0. It may be shown mathematically that, because of geometrical limitations wherein the bottom of the hot-side partition 54 abuts the lower-left edge of the rack 50, and/or the top of the cold-side partition 58 abuts the upper-right edge of the rack 50, only a portion of the θ-β space may actually be attained, as shown by the triangle SUV in FIG. 4. Within the confines of this triangle, the points indicated by the lettered dots A through S are tested experimentally. Thus the prior art (θ=0) is limited to cases A through E, whereas the invention permits any of the cases from A to S.

Figure 5:
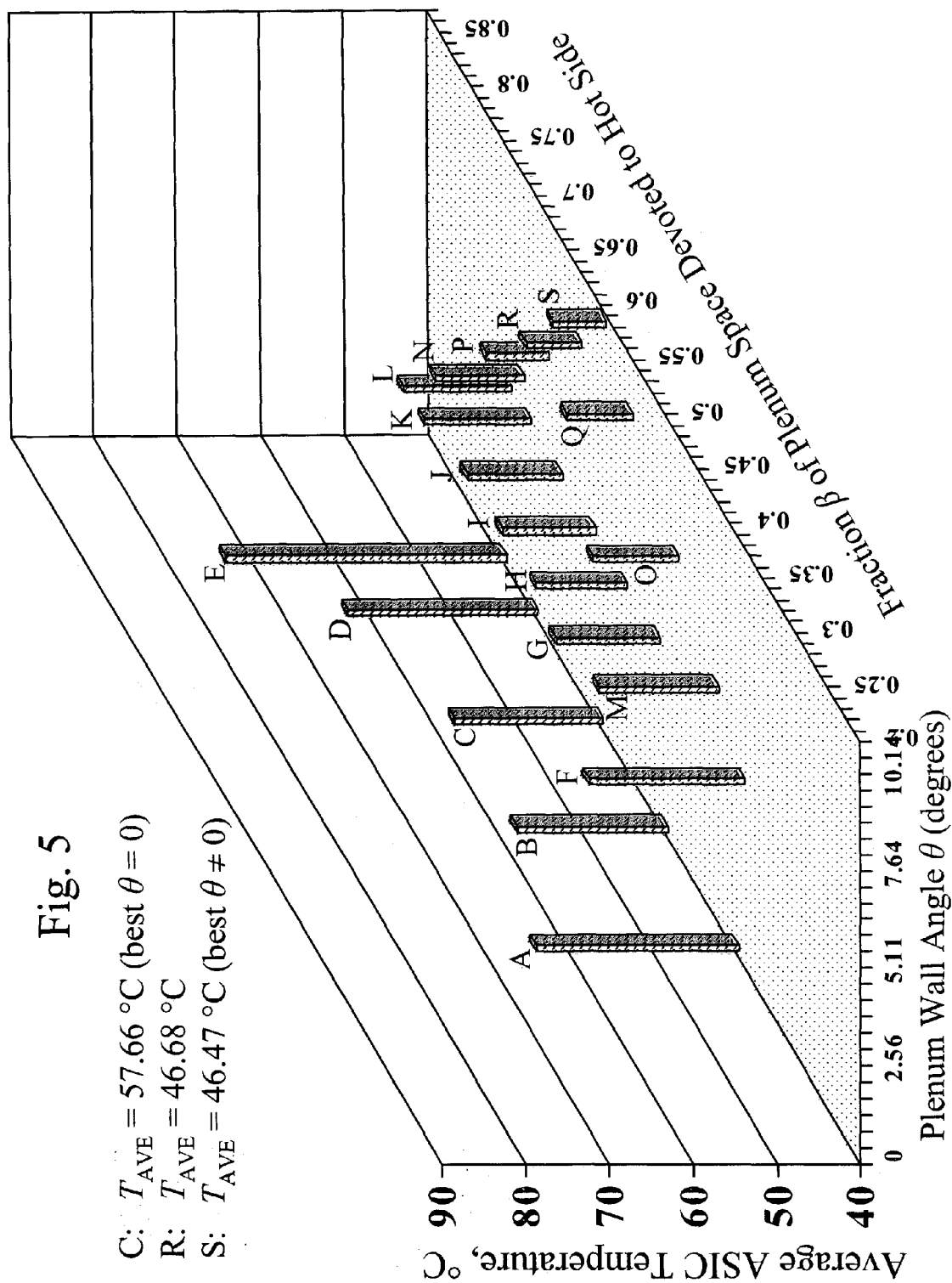
FIG. 5 is a graphical representation of average operating temperatures for heat-producing elements (such as integrated circuits) that result from placement of the sloping partitions in accordance with points illustrated in FIG. 4.
Figure 6:
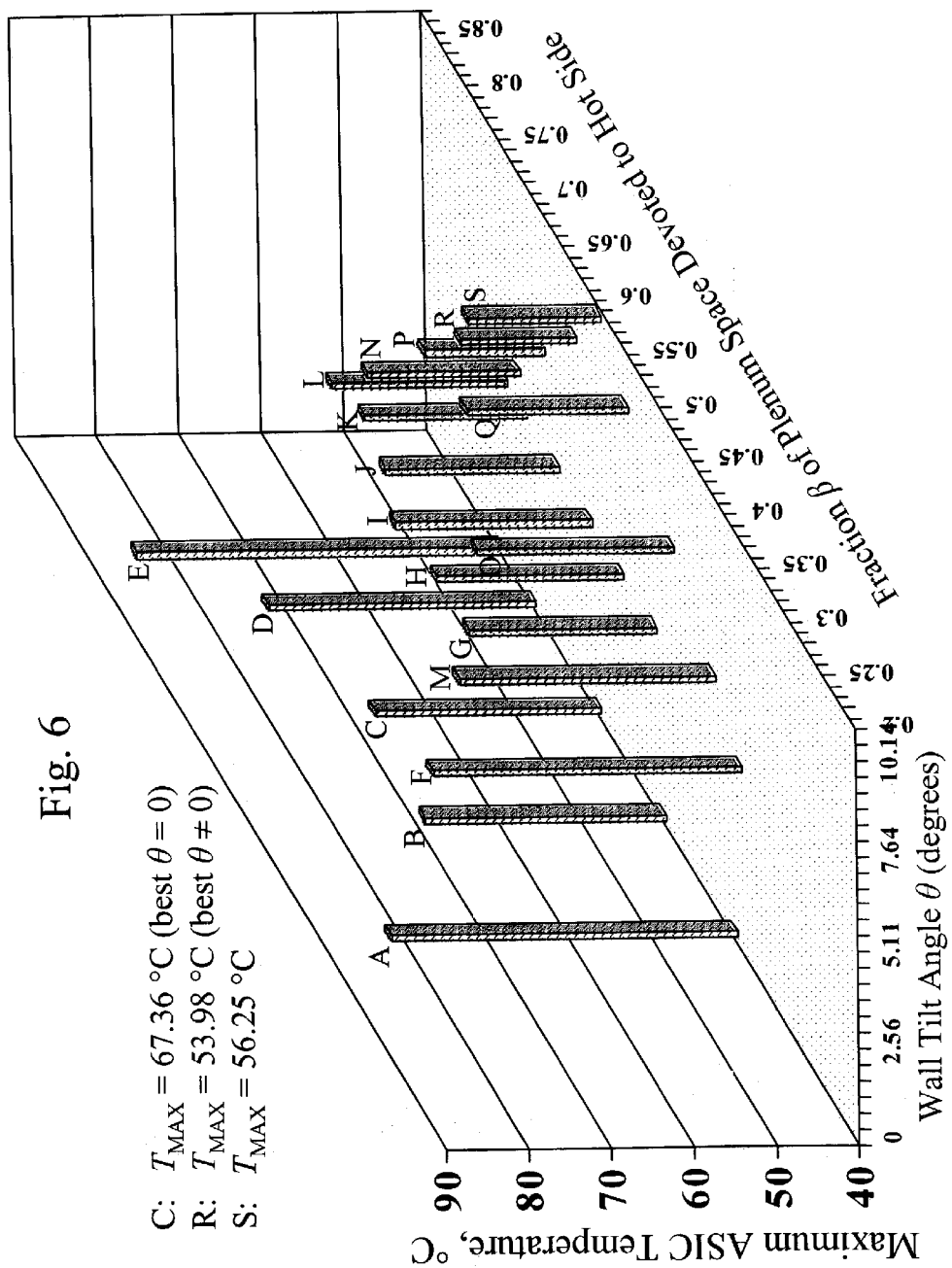
FIG. 6 is a graphical representation of maximum operating temperatures for heat-producing elements (such as integrated circuits) that result from placement of the sloping partitions in accordance with points illustrated in FIG. 4.

To evaluate performance, for each case, the system is run (typically for an hour or so) with a constant cold-air-inlet temperature of 20° C., until thermal equilibrium is reached. At equilibrium, the temperatures of the fifty-one mock-up chips previously mentioned (whose temperatures are monitored by thermocouples) are recorded, and statistics are computed such as the average temperature $T_{AVE}$, the maximum temperature $T_{MAX}$, and the standard deviation of temperature over the fifty-one-chip ensemble. For cases A through S, $T_{AVE}$ and $T_{MAX}$ are shown in graphical form in FIGS. 5 and 6 respectively; the statistics are also shown in tabular form in Table 1 below.

TABLE 1

| Case | θ (degrees) | β | $T_{AVE}$ (° C.) | $T_{MAX}$ (° C.) | Std. Dev. (° C.) |
|---|---|---|---|---|---|
| A | 0.00 | 0.3914 | 64.07 | 81.84 | 10.46 |
| B | 0.00 | 0.4951 | 57.99 | 69.25 | 5.92 |
| C | 0.00 | 0.5989 | 57.66 | 67.36 | 3.93 |
| D | 0.00 | 0.7026 | 62.82 | 72.48 | 4.66 |
| E | 0.00 | 0.7545 | 73.56 | 84.45 | 5.72 |
| F | 4.68 | 0.3777 | 58.49 | 77.39 | 10.30 |
| G | 4.68 | 0.5074 | 52.44 | 62.84 | 5.93 |
| H | 4.68 | 0.5592 | 50.94 | 62.78 | 5.99 |
| I | 4.68 | 0.6111 | 51.11 | 63.81 | 5.94 |
| J | 4.68 | 0.6630 | 51.43 | 61.06 | 4.81 |
| K | 4.68 | 0.7149 | 52.66 | 59.79 | 4.32 |
| L | 4.68 | 0.7408 | 52.84 | 61.31 | 4.59 |
| M | 5.95 | 0.4235 | 54.23 | 70.94 | 8.63 |
| N | 5.53 | 0.7194 | 50.52 | 58.47 | 4.32 |
| O | 7.64 | 0.4845 | 50.31 | 64.00 | 6.49 |
| P | 7.22 | 0.6767 | 47.55 | 54.65 | 3.94 |
| Q | 9.31 | 0.5455 | 47.89 | 59.57 | 5.15 |
| R | 8.89 | 0.6340 | 46.68 | 53.98 | 3.84 |
| S | 10.55 | 0.5913 | 46.47 | 56.25 | 4.34 |

The best case possible with the prior art (θ=0) is case C, whereas the best case possible in accordance with the invention is either Case R or Case S, depending on whether average chip temperature $T_{AVE}$ or maximum chip temperature $T_{MAX}$ is more important. The statistics for these cases, extracted from Table 1, are in Table 2.

TABLE 2

| Case | $T_{AVE}$ (° C.) | $T_{MAX}$ (° C.) | Comment |
|---|---|---|---|
| C | 57.66 | 67.36 | Best case possible with prior art |
| R | 46.68 | 53.98 | Best case with invention (lowest $T_{MAX}$) |
| S | 46.47 | 56.25 | Best case with invention (lowest $T_{AVE}$) |

Thus, using this invention, the average chip for Case R is roughly 11° C. cooler, and the hottest chip 13° C. cooler, than that achievable with the best prior-art case (Case C). According to the rule of thumb previously stated, the average chip lifetime is thus more than doubled by use of the invention.

Alternative Embodiments

Certain variations on the basic scheme shown in FIG. 2 are within the scope of this invention. For example, while the sloped partitions between the hot and cold plenums have been shown as planar, they may instead have a curved profile as illustrated by partitions 100 in FIG. 7, where the partition is convex toward the cold plenum.

FIG. 8 illustrates an alternative in which the sloping partitions are each bent along a line at 102, so as to form relatively small lower rectangular regions 104 at a fairly large angle $\theta_1$, and relatively larger rectangular regions 106 at a relatively smaller angle $\theta_2$. The bend in FIG. 8, like the curve in FIG. 7, causes the partition to be convex toward the cold plenum. Yet another alternative, a straightforward extension of FIG. 8, is to bend the sloped partition at a plurality of lines analogous to the line shown as 102 in FIG. 8.

The arrangements shown in FIGS. 7 and 8, in which the sloped partitions 54 and 58 shown in FIG. 3 would be convex leftward rather than straight, may be advantageous when circuit cards 57 exist close to the bottom of rack 50, because the leftward convexity of partition 54 would prevent undue restriction of the exhaust flow from the lowest fans 62.

The potential advantage to be gained by curving or bending the sloping partitions may be bounded by measuring, in the prototype apparatus described in FIGS. 3A and 3B, the limiting cases when one or both of the sloping partitions 54 and 58 are removed altogether. These limiting cases represent unrealistic situations where plenum space is unconstrained, air flow through the rack is thereby maximized, and electronic chip temperatures are thereby minimized.

The results, shown in FIG. 9, indicate that the average chip temperature in the most ideal case (Case $L_3$, where both sloping partitions 54 and 58 are removed) is about 7° C. lower than the best case (Case S shown in FIG. 5) obtained with sloping partitions that are planar. Thus, for the prototype embodiment, curving or bending the sloping partitions may potentially obtain some fraction of this 7° C. temperature drop, but it cannot obtain more.

While the present invention has been illustrated in the context for cooling electronic equipment, and in particular, electronic equipment placed in racks in a data storage center, it will be understood that the principles of the present invention may be utilized to cool many different types of electronic equipment, and many types of equipment in general. While the preferred cooling medium discussed herein is air, it will be appreciated that in accordance with the principles of the invention, a variety of fluids may be used in applications where entry by human being is not as important, including other gases and non-corrosive and non-conducting liquids such as cooling oils. In such cases, provisions are made for containing the fluid by appropriate fluid-tight enclosures.

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. For example, although the heat-producing devices are described herein as racks arranged in a rectilinear row, the principles of the invention also apply to any heat-producing equipment cooled by a fluid, and to cases where the equipment is laid out along a generalized coordinate, which includes curvilinear as well as rectilinear coordinates. For example, racks of electronic equipment may be placed in a circle so that the spaces between the racks are larger at the circumferential perimeter than elsewhere. Further, the circuit cards and the racks in which they are placed, when viewed from the top, may be shaped substantially as sectors of a circle, with spaces between the racks also being shaped substantially as sectors. Thus the invention may be applied to these geometries, and to many other geometries.

It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments have been provided as an example and not as a limitation. The scope of the invention is defined by the appended claims.

Having thus described the invention, what is claimed as new and it is desired to secure by Letters Patent is as follows:

1. An apparatus that uses a fluid cooling medium to cool a plurality of heat-producing devices arranged in a row along a generalized coordinate direction, with a space between each adjacent pair of devices, the apparatus comprising:
in each space a partition that defines a boundary between a first plenum and a second plenum, the first plenum being used to carry cooling medium across an entrance and thence into a first heat-producing device located on a first side of the partition facing the first plenum, and the second plenum being used to carry cooling medium away from a second heat-producing device located on a second side of the partition facing the second plenum and thence across an exit, wherein the partition is disposed so that the first plenum becomes smaller in cross-sectional area as distance increases from the entrance, and the second plenum becomes larger in cross sectional area as distance decreases toward the exit, the cross sectional area of each plenum being substantially matched to local volumetric flow rate, so that pressure drop of fluid flowing in the plenums is reduced, and wherein the heat producing devices are chips, the chips being on circuit cards, the cards being in a horizontal plane so that said fluid cooling medium flows between said circuit cards from a first plenum to a second plenum.

2. The apparatus as recited in claim 1, wherein the heat-producing devices are disposed in parallel to one another, the first plenum and the second plenum are disposed between each adjacent pair of heat-producing devices, and the first plenum and the second plenum are complimentary in size and shape so as to occupy the space between adjacent heat-producing devices.

3. The apparatus of claim 1, wherein the partition is angled with respect to the two adjacent heat-producing devices so as to extend from a position that is, at the entrance, further from the first heat-producing device than it is from the second heat-producing device, and is, at the exit, further from the second heat-producing device than it is from the first heat-producing device.

4. The apparatus as recited in claim 3, wherein the heat-producing devices are collections of equipment disposed in racks.

5. The apparatus of claim 1, wherein the heat-producing devices are collections of electronic equipment disposed in racks.

6. The apparatus of claim 1, wherein the heat-producing devices are disposed in racks, the racks being configured to be supported on a raised floor, the cooling medium being conducted to the first plenums through openings in the floor.

7. The apparatus as recited in claim 6, further comprising a fluid-moving apparatus for facilitating flow of the cooling medium.

8. The apparatus of claim 7, wherein the fluid-moving apparatus circulates the cooling medium from the second plenums to the space below the floor.

9. The apparatus of claim 7, wherein the fluid-moving apparatus comprises a plurality of fans.

10. The apparatus of claim 9, wherein the fans are disposed in planar arrays adjacent to the heat-producing devices.

11. The apparatus of claim 8 wherein the fluid-moving apparatus comprises:
apparatus that circulates the cooling medium from the second plenums to the space below the floor, and
a plurality of fans.

12. The apparatus of claim 11 wherein the fans are disposed in planar arrays adjacent to the heat-producing devices.

13. The apparatus as recited in claim 1, further comprising a circulator for circulating the cooling medium.

14. The apparatus of claim 13, further comprising cooling apparatus for cooling said medium after it leaves the second plenums and prior to returning said medium to a space beneath the floor.

15. The apparatus of claim 1, wherein said partition is substantially planar.

16. The apparatus of claim 1, wherein the partition is curved.

17. The apparatus of claim 1, wherein the partition is curved to be convex toward the first plenum.

18. The apparatus of claim 1, wherein the partition has at least one bend along a line so as to define a plurality of planar regions.

19. The apparatus of claim 18, wherein the at least one bend in the partition reduces the cross section of the first plenum and increases cross section of the second plenum.

20. The apparatus of claim 18, wherein the partition has a bend that results in a first region having a first angle $\theta_1$ with respect to a plane of the heat-producing device through which cooling medium enters the heat-producing device, and a second region having a second angle $\theta_2$ with respect to the plane, where $\theta_1$ is greater than $\theta_2$, and the first region is smaller in size than said second region.

21. The apparatus of claim 1, wherein the second plenum is larger in volume than said first plenum.

22. An arrangement for a room, comprising;
spaced parallel units of heat-producing equipment, and between said units of equipment, a partition defining a boundary between a first plenum for conveying a cooling medium to enter a first piece of said equipment and a second plenum for conveying the cooling medium from a second piece of said equipment, wherein said partition is disposed so that said first plenum becomes smaller in cross sectional area as distance increases from where cooling fluid enters said first plenum, and so that said second plenum becomes larger in cross sectional area as distance decreases to where the fluid leaves said second plenum, the cross sectional area of each plenum being substantially matched to local volumetric flow rate, so that pressure drop of fluid flowing in the plenums is reduced, and wherein the heat producing devices are chips, the chips being on circuit cards, the cards being in a horizontal plane so that said fluid cooling medium flows between said circuit cards from a first plenum to a second plenum.

23. A method for configuring apparatus for cooling rows of equipment with a cooling medium, comprising:
placing a partition so as to define a boundary between a first plenum for carrying the cooling medium to enter said rows of equipment and a second plenum for carrying the cooling fluid after it has cooled the equipment, wherein said partition is placed so that said first plenum becomes smaller in cross sectional area as distance increases from where cooling fluid enters said first plenum, and so that said second plenum becomes larger in cross sectional area as distance decreases to where said the fluid leaves said second plenum, the cross sectional area of each plenum being substantially matched to local volumetric flow rate, so that pressure drop of fluid flowing in the plenums is reduced, and wherein the rows of equipment include circuit cards having heat producing chips, the cards being in a horizontal plane so that said fluid cooling medium flows between said circuit cards from a first plenum to a second plenum.

* * * * *